(12) United States Patent
Okada

(10) Patent No.: US 7,565,926 B2
(45) Date of Patent: Jul. 28, 2009

(54) HEAT EXCHANGE METHOD AND HEAT EXCHANGE APPARATUS

(75) Inventor: Yoshiyuki Okada, Shioya-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 708 days.

(21) Appl. No.: 11/177,323

(22) Filed: Jul. 11, 2005

(65) Prior Publication Data

US 2006/0005554 A1    Jan. 12, 2006

(30) Foreign Application Priority Data

Jul. 12, 2004    (JP)    ............................ 2004-205061

(51) Int. Cl.
  F25B 29/00    (2006.01)
  F24F 11/06    (2006.01)
(52) U.S. Cl. ...................................... 165/201
(58) Field of Classification Search ................. 165/178, 165/201, 244, 247
  See application file for complete search history.

(56) References Cited

U.S. PATENT DOCUMENTS

2006/0157576 A1 *    7/2006    Eisenhour .................... 237/28

FOREIGN PATENT DOCUMENTS

JP    2002-48381    2/2002

* cited by examiner

Primary Examiner—Marc E Norman
(74) Attorney, Agent, or Firm—Fitzpatrick, Cella, Harper & Scinto

(57) ABSTRACT

A heat exchange method which uses a heat exchange unit for exchanging heat between first and second media to adjust a temperature of the first medium. The method includes (a) a detection step of detecting temperatures of the first and second media to enter the heat exchange unit, and (b) an adjustment step of adjusting a flow rate of the second medium based on the temperatures of the first and second media detected in the detection step. The adjustment step includes (i) a target heat quantity calculation step of calculating a target heat quantity based on a target temperature of the first medium and the temperature of the first medium detected in the detection step, (ii) a first temperature difference calculation step of calculating a first temperature difference based on the target temperature and the temperature of the second medium detected in the detection step, (iii) a setting step of setting a provisional target flow rate of the second medium, (iv) a second temperature difference calculation step of calculating a second temperature difference based on the target heat quantity, the provisional target flow rate, and the temperatures of the first and second media detected in the detection step, (v) an average temperature difference calculation step of calculating one of a logarithmic average temperature difference and an average temperature difference at the heat exchange unit based on the first and second temperature differences, (vi) a heat exchange quantity calculation step of calculating a heat exchange quantity at the heat exchange unit based on one of the logarithmic average temperature difference and the average temperature difference and a heat exchange gain of the heat exchange unit, and (vii) a determination step of determining a target flow rate of the second medium based on a result of a comparison between the heat exchange quantity and the target heat quantity.

8 Claims, 15 Drawing Sheets

WAFER PROCESS

HEAT EXCHANGE METHOD AND HEAT EXCHANGE APPARATUS

This application claims priority from Japanese Patent Application No. 2004-205061, filed on Jul. 12, 2004, the entire contents of which are hereby incorporated by reference herein.

FIELD OF THE INVENTION

The present invention relates to a heat exchange method and apparatus, which use a heat exchange unit for exchanging heat between first and second media, to adjust the temperature of the first medium, an apparatus including the heat exchange apparatus and an exposure system, and a device manufacturing method using the apparatus including the exposure system.

BACKGROUND OF THE INVENTION

Recent semiconductor integrated circuits, such as ICs and LSIs, require high productivity, and accordingly, the power consumption of a semiconductor exposure apparatus tends to increase. The feature size of a circuit pattern shrinks more and more, and the environment in the exposure apparatus must be maintained more stably. In particular, as the power consumption increases, an efficient cooling apparatus or heat recovery apparatus, which has a very high temperature stability, is needed.

As a cooling or heat recovery apparatus, one using a refrigerating cycle, which includes a compressor, a condenser, and an evaporator is known (for example, see Japanese Patent Laid-Open No. 2002-48381). According to a cooling apparatus having this arrangement, load heat in an exposure apparatus is recovered by a circulating medium. The recovered heat is shifted to factory cooling water, which is supplied from a factory, has a comparatively high temperature, to perform cooling and heat recovery.

In general, when load fluctuations occur, the rotational speed of the compressor is controlled by an inverter. After heat is recovered by the refrigerating cycle when necessary, the circulating medium is heated again by an electrical heater, or the like, to improve the temperature stability.

In an old-fashioned semiconductor manufacturing factory, the factory cooling water often has a comparatively high temperature of 20° C. to 30° C. In a recent high-productivity factory for semiconductor devices having very small feature sizes, the factory cooling water often has a low temperature of about 10° C. to 18° C.

In the prior art described above, a compressor or reheating electrical heater is used, even when low-temperature factory cooling water is supplied, as in the recent semiconductor manufacturing factory. The power increases to lead to a cooling apparatus poor in efficiency. Also, inverter control and electrical heater control are performed to improve the temperature stability. Accordingly, the number of constituent components increases, the cost increases, and the apparatus becomes bulky.

When the load fluctuates sharply, or the temperature of the factory cooling water fluctuates, sufficient temperature stability cannot be obtained. In some cases, exposure of finer circuit patterns is adversely affected.

SUMMARY OF THE INVENTION

The present invention has been made in view of the above disadvantages, and has as its exemplified object to provide a heat exchange technique capable of stable fluid temperature adjustment.

According to the present invention, the foregoing object is attained by providing a heat exchange method, which uses a heat exchange unit for exchanging heat between first and second media, to adjust a temperature of the first media, comprising:

a detection step of detecting temperatures of the first and second media input to the heat exchange unit; and an adjustment step of adjusting a flow amount of the second medium on the basis of the temperatures of the first and second media detected in the detection step.

In a preferred embodiment, the adjustment step includes:

a target heat quantity calculation step of calculating a target heat quantity on the basis of the target temperature of the first medium and the temperature of the first medium detected in the detection step, an average temperature calculation step of calculating an average temperature difference at the heat exchange unit, on the basis of the target heat quantity calculated in the target heat quantity calculation step and a heat exchange gain of the heat exchange unit, and a flow amount calculation step of calculating the flow amount of the second medium, which is necessary for heat exchange of the target heat quantity, on the basis of the average temperature difference calculated in the average temperature calculation step, the target temperature, and the temperature of the first and second media detected in the detection step.

In a preferred embodiment, the adjustment step includes:

a target heat quantity calculation step of calculating a target heat quantity, on the basis of the target temperature of the first medium and the temperature of the first medium detected in the detection step, a first temperature difference calculation step of calculating a first temperature difference on the basis of the target temperature and the temperature of the second medium detected in the detection step, an assuming step of assuming a target flow amount of the second medium, a second temperature difference calculation step of calculating a second temperature difference on the basis of the target heat quantity, the assumed target flow amount, and the temperatures of the first and second media detected in the detection step, an average temperature difference calculation step of calculating one of a logarithmic average temperature difference and an average temperature difference at the heat exchange unit, on the basis of the first and second temperature differences, a heat exchange quantity calculation step of calculating a heat exchange quantity at the heat exchange unit, on the basis of one of the logarithmic average temperature difference and a heat exchange gain of the heat exchange unit and an average temperature difference, and a determination step of determining the target flow amount of the second medium, on the basis of a result of a comparison between the heat exchange quantity and the target heat quantity.

In the adjustment step, the flow amount of the second medium is adjusted so as to compensate for a fluctuation of the heat exchange gain of the heat exchange unit, the fluctuation being caused by the flow amount of the second medium.

In a preferred embodiment, the flow amount of the second medium is adjusted so as to compensate for the fluctuation of the gain on the basis of one of the logarithmic average temperature difference and the average temperature difference.

According to the present invention, the foregoing object is achieved by providing a heat exchange apparatus, which uses a heat exchange unit for exchanging heat between first and second media, to adjust a temperature of the first medium, the apparatus comprising:

a first sensor which detects a temperature of the first medium input to the heat exchange unit;

a second sensor which detects a temperature of the second medium input to the heat exchange unit; and an adjustment system which adjusts a flow amount of the second medium on the basis of outputs from the first and second sensors.

In a preferred embodiment, the adjustment system:

calculates a target heat quantity on the basis of a target temperature of the first medium and the output from the first sensor, calculates an average temperature difference at the heat exchange unit, on the basis of the target heat quantity and a heat exchange gain of the heat exchange unit, and calculates a flow amount of the second medium, which is necessary for heat exchange of the target heat quantity, on the basis of the average temperature difference, the target temperature, and the outputs from the first and second sensors.

In a preferred embodiment, the adjustment system:

calculates a target heat quantity on the basis of a target temperature of the first medium and the output from the first sensor, calculates a first temperature difference on the basis of the target temperature and the output from the second sensor, assumes a target flow amount of the second medium, calculates a second temperature difference on the basis of the target heat quantity, the assumed target flow amount, and the outputs from the first and second sensors, calculates one of a logarithmic average temperature difference and an average temperature difference at the heat exchange unit, on the basis of the first and second temperature differences, calculates a heat exchange quantity at the heat exchange unit on the basis of a heat exchange gain of the heat exchange unit and one of the logarithmic average temperature difference and the average temperature difference, and determines a target flow amount of the second medium, on the basis of a result of a comparison between the heat exchange quantity and the target heat quantity.

In a preferred embodiment, the adjustment system adjusts the flow amount of the second medium, so as to compensate for a fluctuation of the heat exchange gain of the heat exchange unit, the fluctuation being caused by the flow amount of the second medium.

In a preferred embodiment, the flow amount of the second medium is adjusted so as to compensate for the fluctuation of the gain, on the basis of one of the logarithmic average temperature difference and the average temperature difference.

According to the present invention, the foregoing object is attained by providing an apparatus comprising:

an exposure system which includes a heating element and exposes a substrate to a pattern of an original; and a heat exchange apparatus as discussed above.

According to the present invention, the foregoing object is attained by providing a method of manufacturing a device, the method comprising steps of:

exposing a substrate to a pattern using an apparatus as discussed above; developing the exposed substrate; and processing the developed substrate to manufacture the device.

Other features and advantages of the present invention will be apparent from the following description, taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE PREFERRED EMBODIMENTS

Preferred embodiments of the present invention will be described in detail in accordance with the accompanying drawings.

First Embodiment

The structure of an exposure apparatus, to which the heat exchange apparatus and method according to the present invention can be applied, will be described with reference to FIG. 1.

Figure 1:
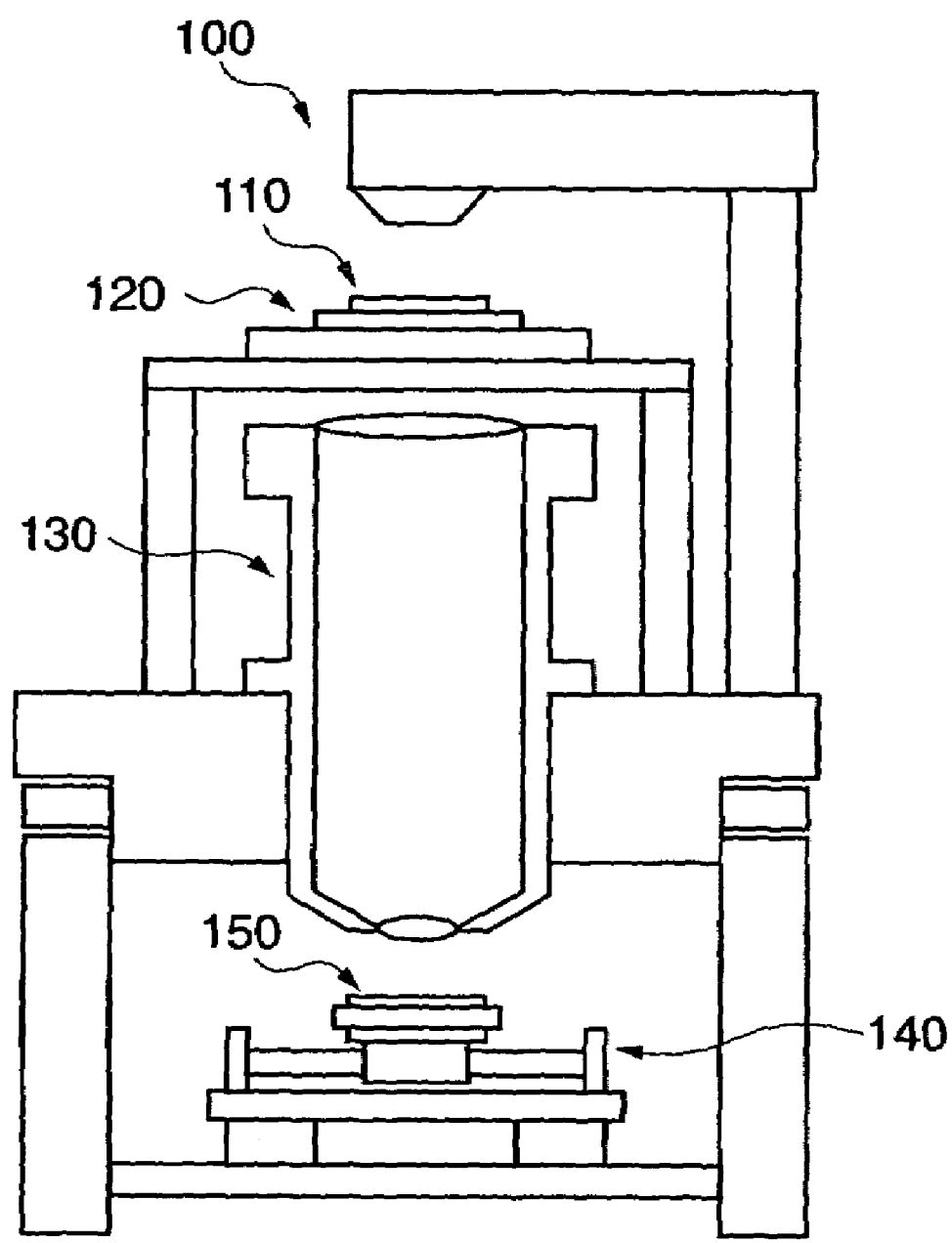
FIG. 1 is a view showing the structure of a general exposure apparatus.

FIG. 1 is a view showing the structure of a general exposure apparatus.

Exposure light emitted from an exposure light source (not shown) irradiates a reticle 110 set on a reticle stage 120 by an illumination optical system 100. Light transmitted through the reticle 110 is transmitted through a projection optical system 130 to reach a wafer 150 placed on a wafer stage 140, to print a fine pattern drawn on the reticle 110 onto the respective shots on the wafer 150. As the exposure light source, a KrF laser source or a short-wavelength ArF laser source for further micropatterning is used often.

In an exposure apparatus called a stepper, the reticle stage 120 is set still. The wafer stage 140 is set still during exposure, and is stepped for exposure of the next shot when the exposure is ended. In an exposure apparatus called a scanning stepper, the reticle stage 120 and wafer stage 140 are scanned in the opposite directions in synchronism with each other. Exposure is performed during sync scanning. When the exposure is ended, the wafer stage 140 is stepped for exposure of the next shot.

In the scanning stepper, to further improve the productivity, both the reticle stage 120 and wafer stage 140 are accelerated by higher accelerations and sync-scanned, and exposed at higher speeds. In general, assume that reduction exposure is performed with an exposure reduction ratio of the reticle 110 to wafer 150 being 4:1. The ratios of the accelerations and speeds of the reticle stage 120 to wafer stage 140 are also 4:1. Thus, the acceleration and speed of the reticle stage 120 are four times higher than those of the wafer stage 140.

To improve the productivity, the acceleration and speed of each stage increase more and more. The acceleration and speed of the wafer stage 140 are increased to about 1 G to about 1.5 G and about 300 mm/s to about 500 mm/s, respectively.

In this manner, both the reticle stage 120 and wafer stage 140 must be driven very fast to improve the productivity, and their positions or speeds must be controlled very accurately to realize micropattern exposure.

In general, stages are often levitated by a pneumatic pressure or a magnetic force and are sync-scanned or stepped by linear motors employing the principle of the Lorentz force or, depending on the case, actuators, such as planar motors. In this case, a frictional force in the horizontal direction is very small. Hence, a thrust which is generated by the actuator, as it is necessary for sync scanning or stepping, is proportional to the acceleration and mass of the stage.

For example, the thrust generated by the linear motor is proportional to the driving current, and heat generated by the linear motor is equal to the product of the resistance of the motor winding and the square of the driving current. Accordingly, heat generated in the linear motor increases in proportion to the generated thrust, i.e., in proportion to the square of the acceleration of the stage. In other words, when the acceleration is doubled, heat generated by the linear motor becomes multiplied by four.

The stage positions of the reticle stage 120 and wafer stage 140 are controlled precisely on the order of a nanometer. For this purpose, generally, the stage positions are constantly monitored by laser interferometers and feedback-controlled. If, however, large heat is generated by stage driving, the heat quantity disturbs the optical paths of the laser interferometers. Consequently, the refractive indices of air in the optical paths fluctuate to cause a large error in position measurement of the stages. Therefore, to control the stages on the order of a nanometer, the temperature fluctuations of the optical paths of the interferometers must be 0.01° C. or less.

To realize very fine micropattern exposure with high productivity, a cooling apparatus, which removes the large amount of generated heat more accurately, to recover the heat, is necessary.

Each stage of the reticle stage 120 and wafer stage 140 generates a very large amount of heat during exposure. When the wafer 150 or reticle 110 is to be changed, the reticle stage 120 and wafer stage 140 are stopped and, accordingly, heat generated by them becomes almost zero. In other words, to the cooling apparatus, the load fluctuates very sharply with a very large width.

The exposure apparatus contains many precision measurement systems in addition to the stage. To realize very fine micropattern exposure, a cooling apparatus, which cools more accurately to recover heat, is necessary.

In the old-fashioned semiconductor manufacturing factory, the factory cooling water often has a comparatively high temperature of 20° C. to 30° C. In the recent high-productivity factory for semiconductor devices having very small feature sizes, the factory cooling water often has a low temperature of about 10° C. to 18° C., which is lower than the temperature of factory cooling water used in the old-fashioned semiconductor manufacturing factory. For this reason, a cooling apparatus employing a refrigerating cycle, which uses a compressor and an inverter, is becoming unnecessary.

Although the temperature of the factory cooling water is low, it sometimes fluctuates by 1° C. to 2° C., and with very sharp rate fluctuations.

Other than energy conservation, the semiconductor manufacturing factory seeks to optimize many other features, such as improvement of the space efficiency of the manufacturing line, feature size shrinkage, and the like.

Hence, there is required a power-saving, high-efficiency, low-cost, and compact cooling apparatus in an exposure apparatus for performing cooling or heat recovery, which can control temperature very stably against load fluctuations and factory cooling water fluctuations, when low-temperature factory cooling water is supplied.

A cooling apparatus in an exposure apparatus according to the first embodiment will be described with reference to FIG. 2.

Figure 2:
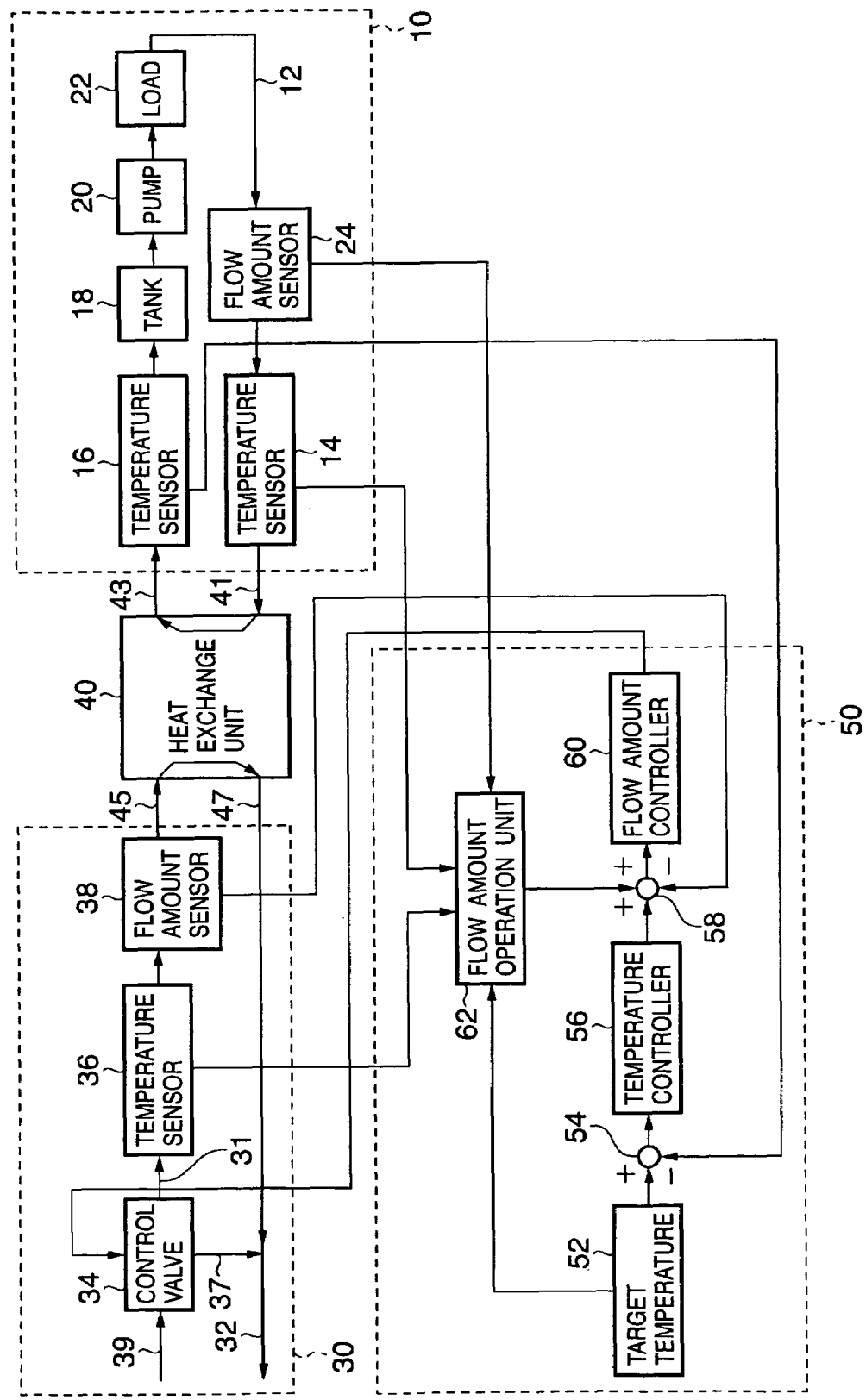
FIG. 2 is a block diagram of a cooling apparatus in an exposure apparatus according to the first embodiment of the present invention.

FIG. 2 is a block diagram of the cooling apparatus in the exposure apparatus according to the first embodiment of the present invention.

A broken-line portion 10 indicates the entire circuit of the first medium, a broken-line portion 30 indicates the entire circuit of the second medium, and a broken-line portion 50 indicates the entire portion of the respective types of controllers. Reference numeral 12 denotes a first medium circuit; and reference numeral 22, a load in the exposure circuit. The load 22 corresponds to the stage and respective types of precision measurement systems in the exposure apparatus of FIG. 1.

The first medium passes through the load 22 to recover the load heat, and shifts the heat to a second medium circuit 32 through a heat exchange unit 40.

In the first medium circuit 12, a first temperature sensor 16 is attached to an outlet 43 side circuit of the heat exchange unit 40, and a second temperature sensor 14 is attached to an inlet 41 side circuit of the heat exchange unit 40. The first medium forms a pump 20 to form a circulation system. The pump 20 may be attached to either the inlet 41 side or outlet 43 side of the heat exchange unit 40. A tank 18 is attached when necessary. The tank 18 may be attached to either the inlet 41 side or outlet 43 side of the heat exchange unit 40.

When necessary, a flow amount sensor 24 to measure the circulating flow amount of the first medium may be attached. Usually, the flow amount sensor 24 need not be attached, because the pressure loss of the first medium circuit 12 and the rotational speed of the pump 20 are adjusted, so that the circulating flow amount becomes a predetermined value. Even if the flow amount sensor 24 should be attached, its location is not particularly limited.

The first medium suffices as long as it is a fluid, and may be a liquid or a gas. As the liquid, pure water or brine, which is generally used as a refrigerant, can be employed. When gas is to be used, the pump 20 is replaced by a fan.

The second medium is factory cooling water 39 supplied from the factory and, generally, is often water or pure water. In the recent high-productivity factory for semiconductor devices having very small feature sizes, the factory cooling water is often about 10° C. to 18° C. The factory cooling water is branched by a control valve 34 into a main circuit 31 and a branch circuit 37. The main circuit 31 is provided with a third temperature sensor 36 and flow amount sensor 38. The main circuit 31 is further connected to an inlet 45 of the heat exchange unit 40. An outlet 47 of the heat exchange unit 40 merges with the branch circuit 37, and is connected to the factory plant.

The respective temperature sensors 14, 16 and 36 are sensors, such as thermo-couples or platinum resistors, and are selected in accordance with the required temperature accuracy. The control valve 34 is preferably one which can perform proportional control, and may include a proportional three-way valve, or two proportional three-way valves (or proportional electromagnetic valves) 33 and 35, shown in FIG. 3. When the two proportional two-way valves (or proportional electromagnetic valves) 33 and 35 are to be used, they require push-pull driving. Accordingly, a controller, to be described later, is formed to generate two signals, i.e., a push signal and a pull signal, like a controller 60b.

Each of the flow amount sensors 24 and 38 can be of any type, such as a Karman™ vortex sensor, an electromagnetic sensor, or an impeller sensor. When the first medium is gas, a mass-flow sensor, or the like, is used as the flow amount sensor 24.

As the heat exchange unit 40, a shell-and-tube heat exchange unit, a blazing heat exchange unit, or the like, is used. When the first medium is gas, a cooling coil, or the like, is used. According to the first embodiment, the input and output of the first medium and the input and output of the second medium are connected to oppose each other. In general, a heat exchange unit often employs heat exchange by counterflows, because it is the most efficient. The heat exchange unit can also employ parallel flows in which the inputs and outputs of the first and second media are parallel.

In the portion 50 (also to be referred to as a flow amount adjustment system), including the respective types of controllers, a target temperature 52 and a temperature feedback signal from the first temperature sensor 16 are input to an adder-subtractor 54, and their difference signal is input to a temperature controller 56. The temperature controller 56 performs a control operation with proportional/integral/derivative control, or the like, as will be described later. A temperature control signal from the temperature controller 56 is added to a flow amount signal from a flow amount operation unit 62 by an adder-subtractor 58. When necessary, a flow amount feedback signal from the flow amount sensor 38 is input to the adder-subtractor 58 to form a flow amount control system.

When flow amount control is to be performed, a flow amount controller 60 performs a control operation with proportional/integral/derivative control, or the like. When the flow amount control is not to be performed, the flow amount feedback signal from the flow amount sensor 38 is not input to the adder-subtractor 58, but proportional gain calculation or filtering is performed, when necessary, to apply a flow amount control signal to the control valve 34.

The control valve 34 adjusts the channels of the main circuit 31 and branch circuit 37 in response to the applied flow amount control signal to control the flow amount flowing in the main circuit 31. The second medium of the controlled main circuit 31 passes through the heat exchange unit 40 to recover heat from the first medium, and merges with the branch circuit 37 to shift heat to the factory plant.

The heat exchange unit 40 can adjust the heat recovery quantity of the first medium by the flow amount of the second medium in the main circuit 31. With this arrangement, temperature control can be performed, such that the temperature of the first medium is equal to the target temperature 52.

In this case, the load 22 fluctuates sharply and largely, as described above, and, accordingly, the temperature of the first medium at the inlet 41 of the heat exchange unit 40 fluctuates sharply and largely. When the stages of the exposure apparatus are driven, heat of several kW is generated. Even when the circulating flow amount of the first medium is several tens of L/min, temperature fluctuations of about several degrees Celsius occur.

When the sharp and large temperature fluctuations are to be dealt with only by the feedback control of the first temperature sensor 16, a response delay, or the like, which is a disadvantage of the feedback control, occurs. Therefore, heat of the first medium cannot be recovered accurately, and large temperature fluctuations of about several degrees Celsius occur.

The temperature of the factory cooling water 39 sometimes fluctuates by about 1° C. to 2° C. If the fluctuations are to be dealt with only by the feedback control of the first temperature sensor 16 in the same manner, a response delay, or the like, which is a disadvantage of the feedback control, occurs. Therefore, heat of the first medium cannot be recovered accurately, and large temperature fluctuations of about several degrees Celsius occur.

To deal with the fluctuations of the load 22 and the temperature fluctuations of the factory cooling water 39, the temperature fluctuations are detected by the second temperature sensor 14 and third temperature sensor 36. The flow amount operation unit 62 calculates the flow amount of the second medium, which is necessary to set the first medium to the target temperature, and adjusts the control valve 34. Thus, influences of various types of temperature fluctuations are suppressed.

The operation of the flow amount operation unit 62 of the first embodiment will be described with reference to FIGS. 4 and 5.

Figure 4:
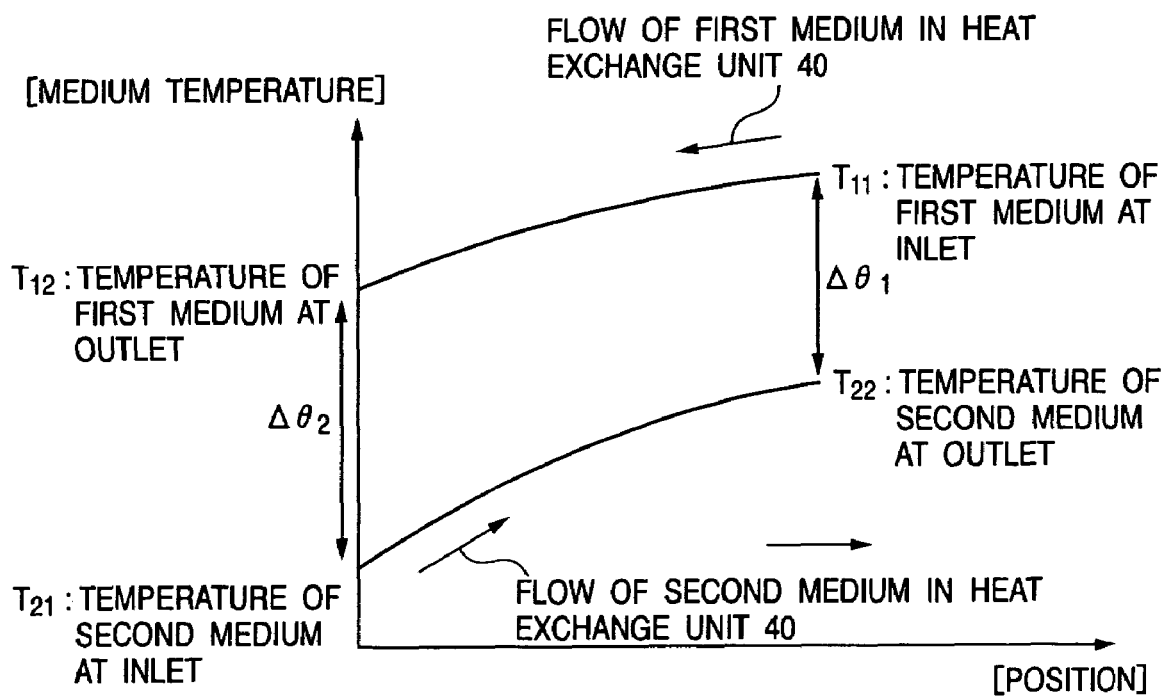
FIG. 4 is a graph showing an example of the temperature characteristics of a heat exchange unit according to the first embodiment of the present invention.
Figure 5:
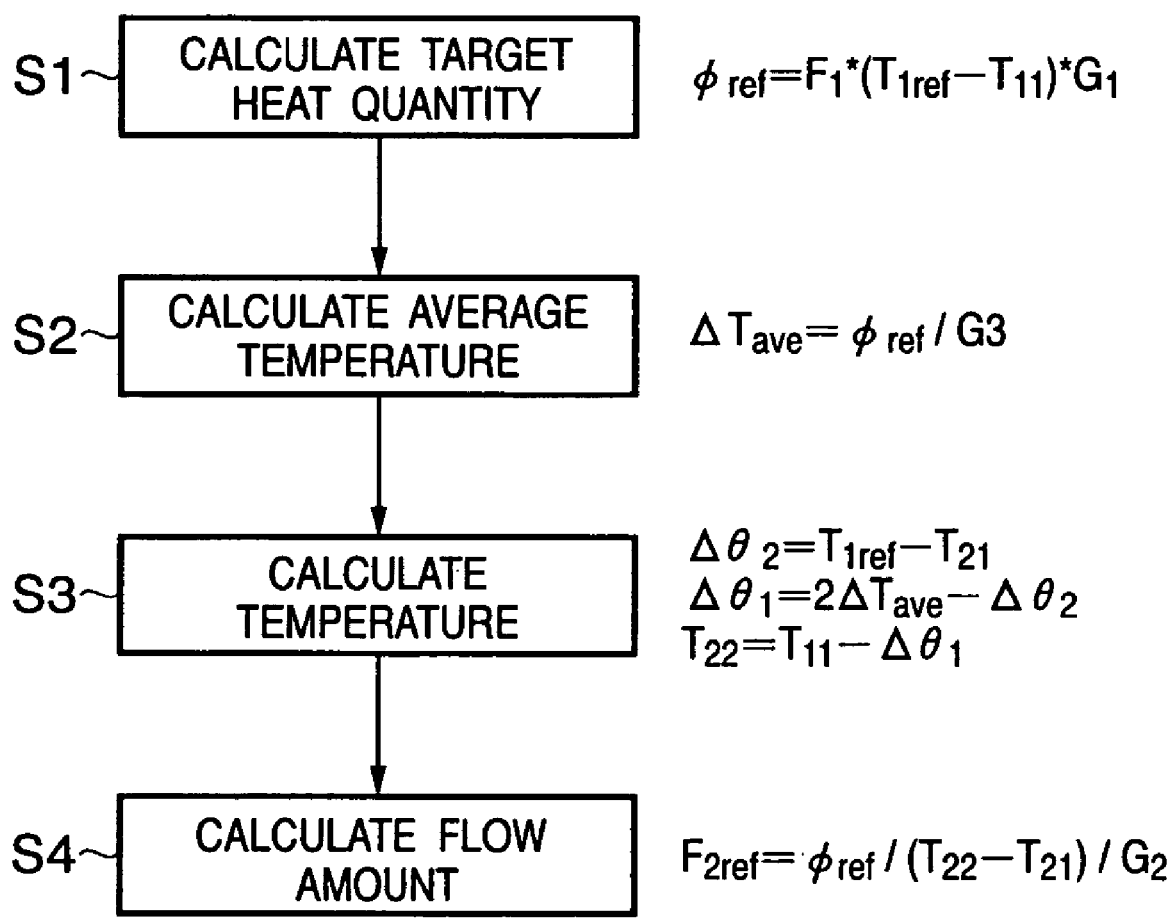
FIG. 5 is an operation flowchart of a flow amount operation unit according to the first embodiment of the present invention.

FIG. 4 is a graph showing an example of the temperature characteristics of the heat exchange unit according to the first embodiment of the present invention. FIG. 5 is an operation flowchart of the flow amount operation unit according to the first embodiment of the present invention.

FIG. 4 will be described. FIG. 4 shows the temperature characteristics of the first and second media in the counter flows, in which the temperature of the first medium of the heat exchange unit 40 at the inlet 41 is expressed as $T_{11}$. The axis of the abscissa represents the passing position in the heat exchange unit 40. At the outlet 43, the heat of the first medium is recovered by the second medium, so that the temperature becomes $T_{12}$. The temperature of the second medium at the inlet 45 is expressed as $T_{21}$. At the outlet 47 of the heat exchange unit 40, the second medium recovers the heat of the first medium, so that its temperature becomes $T_{22}$.

In the heat exchange unit 40, a heat quantity $\phi_1$ recovered from the first medium and a heat quantity $\phi_2$ recovered by the second medium are equal. Hence, the following equations are established.

$$\phi_1 = F_1 * \rho_1 * c_{p1} * (T_{11} - T_{12}) \quad (1)$$

$$\phi_2 = F_2 * \rho_2 * c_{p2} * (T_{22} - T_{21}) \quad (2)$$

$$\phi_1 = \phi_2 \quad (3)$$

where $\phi_1$ and $\phi_2$: heat quantities [W],
$F_1$ and $F_2$: flow amounts [m$^3$/s],
$\rho_1$ and $\rho_2$: densities [kg/cm$^3$], and
$c_{p1}$ and $c_{p2}$: specific heats [kJ/kg° C.].

Suffixes 1 and 2 indicate the first and second media, respectively. W=J/s.

A temperature difference $\Delta\theta_1$ of the first medium at the inlet side of the heat exchange unit 40 from the second medium and a temperature difference $\Delta\theta_2$ of the first medium at the outlet side of the heat exchange unit 40 from the second medium are expressed by the following equations:

$$\Delta\theta_1 = T_{11} - T_{22} \quad (4)$$

$$\Delta\theta_2 = T_{12} - T_{21} \quad (5)$$

In general, a heat exchange quantity Q [W] in the heat exchange unit 40 is expressed by the following equation:

$$Q = KA\Delta T_m \quad (6)$$

where

K: heat passing ratio (W/m$^{2\circ}$ C.),

A: heat transfer area [m$^2$], $\Delta T_m$: logarithmic average temperature difference [° C.]

$$\Delta T_m = (\Delta\theta_2 - \Delta\theta_1)/\ln(\Delta\theta_2/\Delta\theta_1) \quad (7)$$

where K is the heat passing ratio of the heat exchange unit 40 and A is the heat transfer area of the heat exchange unit 40, which are unique to each heat exchange unit 40.

When $\Delta\theta_2 = \Delta\theta_1$, equation (7) becomes indefinite. At this singular point, in place of the logarithmic average temperature difference, an arithmetic average temperature $T_{ave}$ of the following equation is used:

$$T_{ave} = (\Delta\theta_2 + \Delta\theta_1)/2 \quad (8)$$

Figure 6:
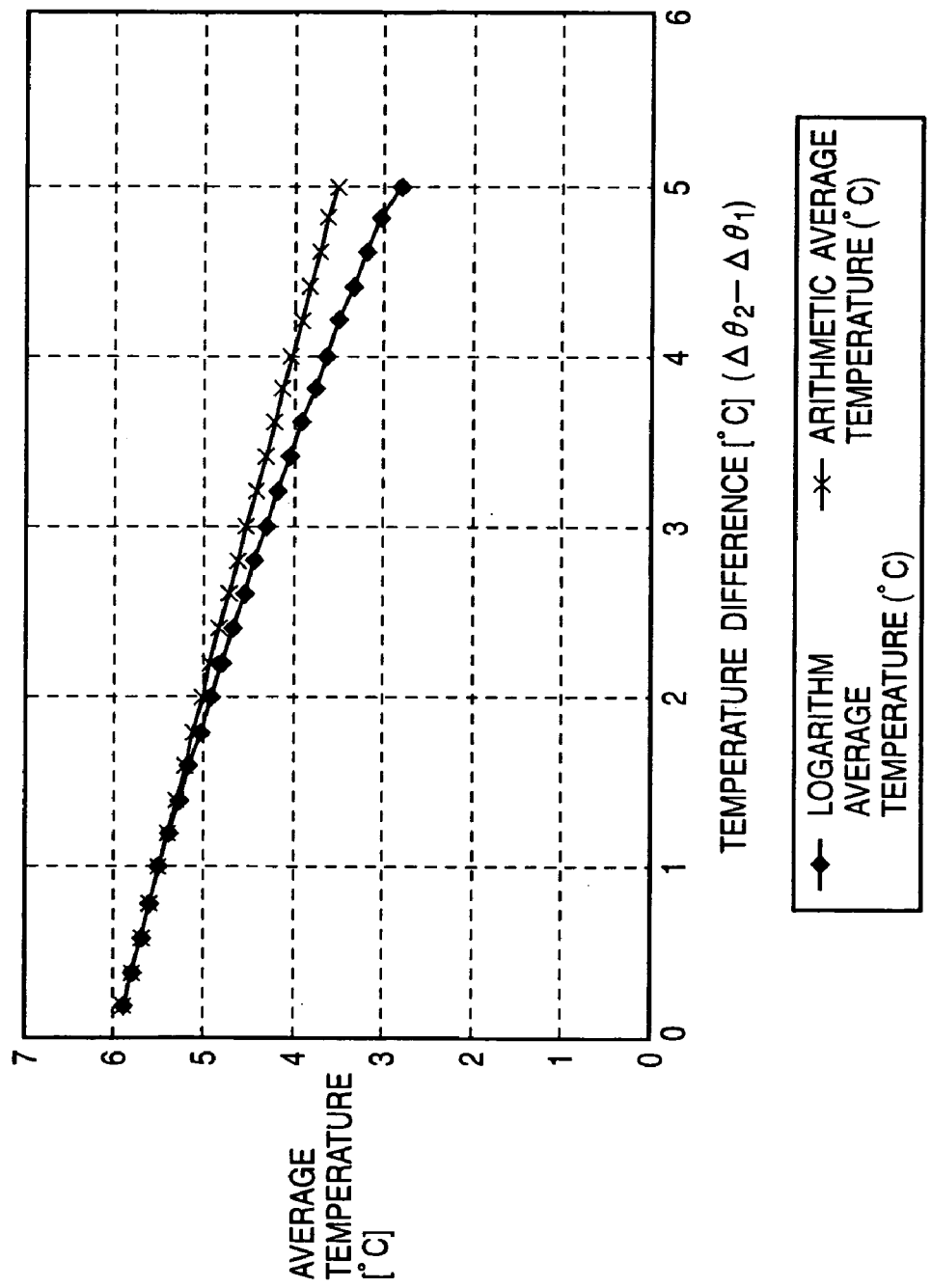
FIG. 6 is a graph showing an example of the temperature characteristics of the heat exchange unit according to the first embodiment of the present invention.

FIG. 6 shows the characteristics of the logarithmic average temperature difference and arithmetic average temperature.

The axis of the abscissa represents $\Delta\theta_2 - \Delta\theta_1$, and the axis of ordinate represents the logarithmic average temperature difference and the arithmetic average temperature.

The zero point on the axis of abscissa is the singular point of the logarithmic average temperature difference. When the temperature difference is small, the logarithmic average temperature difference and arithmetic average temperature are obviously substantially equal. As the temperature difference increases, the logarithmic average temperature difference and arithmetic average temperature gradually differ from each other, and the arithmetic average temperature tends to be high with respect to the logarithmic average temperature difference. Therefore, when $(\Delta\theta_2 - \Delta\theta_1)$ is small, or the error of the arithmetic average temperature from the logarithmic average temperature difference is negligible, the heat exchange quantity in the heat exchange unit 40 can be expressed by the following equation:

$$Q = KAT_{ave}. \quad (9)$$

The heat recovery quantity between the first and second media is equal to the heat exchange quantity in the heat exchange unit 40, and, accordingly, the following equation is established:

$$\phi_1 = \phi_2 = KAT_{ave}. \quad (10)$$

The operation in the flow amount operation unit 62 will be described with reference to FIG. 5.

In step S1, a target heat quantity $\phi_{ref}$ is calculated from a target temperature $T_{1ref}$ from the target temperature 52 and the temperature $T_{11}$ from the second temperature sensor 14:

$$\phi_{ref} = F_1 * \rho_1 * c_{p1} * (T_{1ref} - T_{11}) \quad (11)$$

$$G_1 = \rho_1 * c_{p1} \quad (12)$$

$$G_2 = \rho_2 * c_{p2}. \quad (13)$$

When the flow amount sensor 24 is attached, $F_1$ may be calculated on the basis of the value from the flow amount sensor 24. If a regulated flow amount value is set in advance, $F_1$ may be calculated by substituting it.

In step S2, the average temperature $T_{ave}$ is calculated form the target heat quantity $\phi_{ref}$ obtained by equation (11) and the heat exchange quantity in the heat exchange unit 40 obtained by equation (10):

$$T_{ave} = \phi_{ref}/G_3 \quad (14)$$

$$G_3 = KA. \quad (15)$$

In step S3, various temperatures are calculated from the target temperature $T_{1ref}$, the temperature $T_{21}$ from the third temperature sensor 36, and the temperature $T_{11}$ from the second temperature sensor 14:

$$\Delta\theta_2 = T_{1ref} - T_{21} \quad (16)$$

$$\Delta\theta_1 = 2T_{ave} - \Delta\theta_2 \quad (17)$$

$$T_{22} = T_{11} - \Delta\theta_1. \quad (18)$$

In step S4, a target flow amount $F_{2ref}$ of the second medium is calculated from the various values obtained by calculation and equations (2), (3), and (13):

$$F_{2ref} = \phi_{ref}/(T_{22} - T_{11})/G_2. \quad (19)$$

Therefore, according to the present invention, the temperature fluctuations of the first medium caused by the fluctuations of the load 22 are detected by the second temperature sensor 14. The temperature fluctuations of the second medium caused by the temperature fluctuations of the factory cooling water 39 are detected by the third temperature sensor 36. The average temperature in the heat exchange unit 40 is calculated by the flow amount operation unit 62. In addition, the flow amount of the second medium, which is necessary to set the first medium to the predetermined temperature, is calculated to adjust the control valve 34. The heat of the first medium is recovered by the heat exchange unit 40. Then, the temperature of the first medium is controlled by the first temperature sensor 16 and temperature controller 56.

Even when the load fluctuates sharply, or the temperature of the factory cooling water fluctuates, heat can be recovered quickly and appropriately, so that stable temperature control can be performed.

According to the first embodiment, power devices, such as a compressor or an inverter, and mechanical components, such as a condenser, an evaporator, or an expansion valve, which are used in the prior art, become unnecessary. A power-saving, high-efficiency, low-cost, and compact cooling apparatus for performing cooling or heat recovery, which can control temperature stably against load fluctuations and factory cooling water fluctuations, when factory cooling water having a temperature lower than a predetermined temperature is supplied, can be formed.

Desirably, the present invention is used when $(\Delta\theta_1 - \Delta\theta_2)$ in the heat exchange unit 40 is small, or when the error of the arithmetic average temperature form the logarithmic average temperature difference is negligible.

Figure 7:
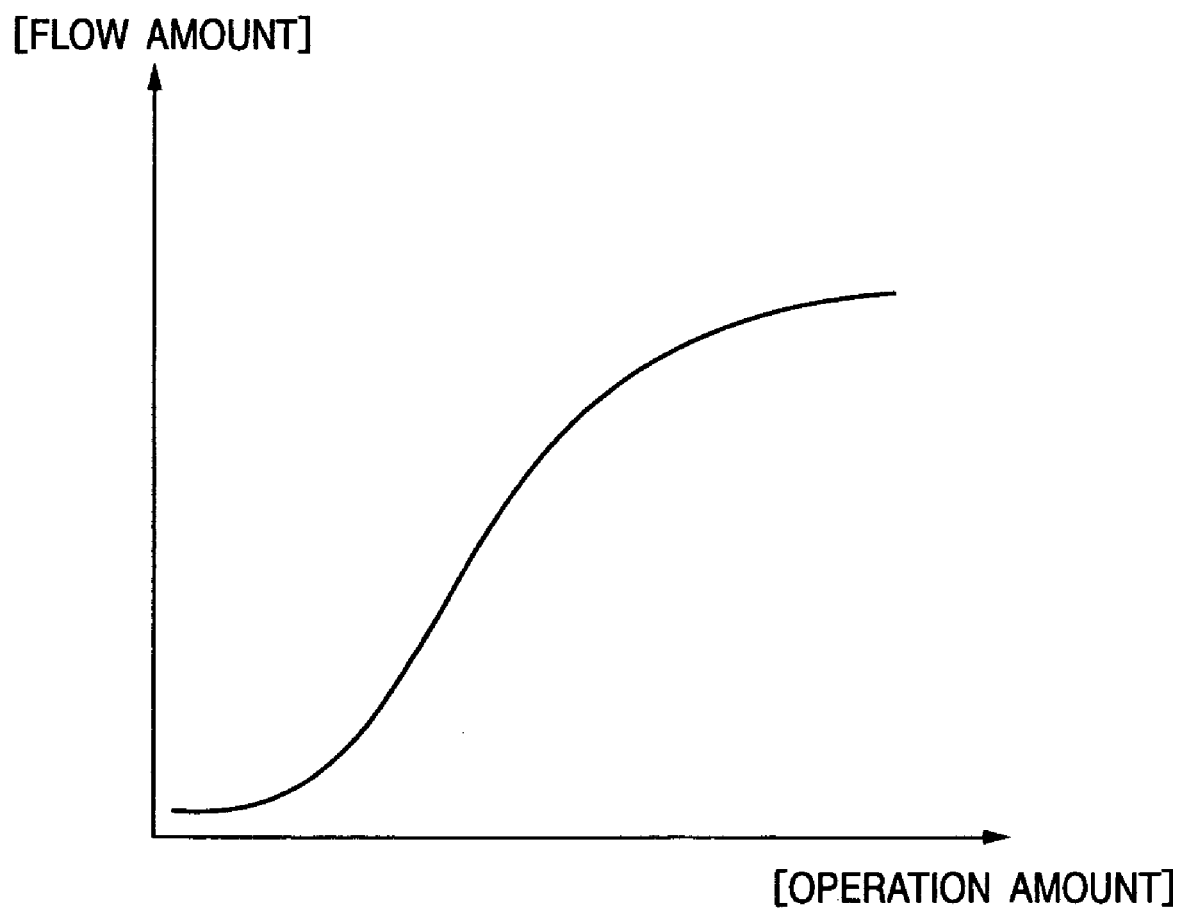
FIG. 7 is a graph showing an example of the flow amount characteristics of the control valve according to the first embodiment of the present invention.

FIG. 7 shows an example of the characteristics when the control valve 34 includes a proportional three-way valve.

Referring to FIG. 7, the axis of the abscissa represents a manipulated variable from the flow amount controller 60, and the axis of the ordinate represents the flow amount of the second medium. In general, the input/output characteristics of a three-way valve are strongly nonlinear. When the three-way valve is used as the flow amount adjustment valve of a temperature control system, the control system tends to be unstable. To improve the nonlinearity of the control valve 34, as described above, the two proportional two-way valves (or proportional electromagnetic valves) 33 and 35, shown in FIG. 3, may be used.

The flow amount may be feedback-controlled by the flow amount sensor 38 and flow amount controller 60 of FIG. 2. As described above, when flow amount control is to be performed, operation of the flow amount controller 60 includes proportional/integral/derivative control, or the like.

As described above, according to the first embodiment, the flow amount of the second medium is controlled by the flow amount sensor 38 and flow amount controller 60 with respect to the target flow amount from the temperature controller 56 and flow amount operation unit 62. Heat is recovered more accurately, and, accordingly, the temperature of the first medium can be controlled more stably.

Second Embodiment

The second embodiment of the present invention will be described.

In the second embodiment, the operation method of the flow amount operation unit 62 in the block diagram of the cooling apparatus in FIG. 2 of the first embodiment is different. This will be described with reference to FIG. 8.

Figure 8:
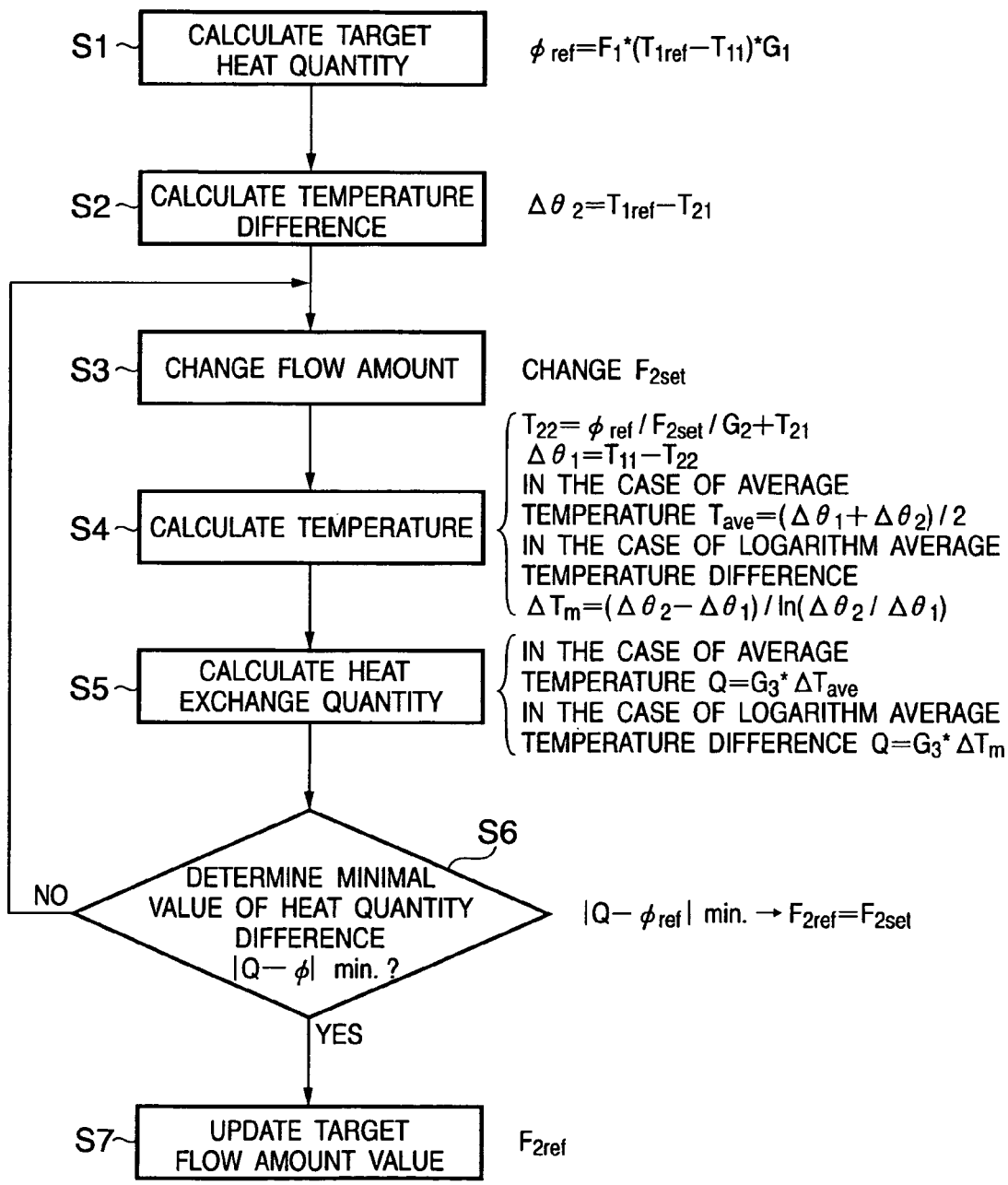
FIG. 8 is an operation flowchart of a flow amount operation unit according to the second embodiment of the present invention.

FIG. 8 is an operation flowchart of a flow amount operation unit according to the second embodiment of the present invention.

In step S1, a target heat quantity $\phi_{ref}$ is calculated from a target temperature $T_{1ref}$ from a target temperature 52 and a temperature $T_{11}$ from a second temperature sensor 14 (see equations (11) to (13)).

When a flow amount sensor 24 is attached, $F_1$ may be calculated on the basis of the value from the flow amount sensor 24. If a regulated flow amount value is set in advance, $F_1$ may be calculated by substituting it.

In step S2, a first temperature difference $\Delta\theta_2$ is calculated from the target temperature $T_{1ref}$ and a temperature $T_{21}$ from a third temperature sensor 36:

$$\Delta\theta_2 = T_{1ref} - T_{21}. \tag{20}$$

In step S3, a flow amount $F_{2set}$ of the second medium is set/changed.

In step S4, a temperature $T_{22}$ of the second medium at the output is calculated from the target heat quantity $\phi_{ref}$ calculated in step S2 and the flow amount $F_{2set}$ and temperature $T_{21}$ of the second medium:

$$T_{22} = \phi_{ref}/F_{2set}/G_2 + T_{21}. \tag{21}$$

Then, a second temperature difference $\Delta\theta_1$ is calculated from the temperature $T_{11}$ and $T_{22}$:

$$\Delta\theta_1 = T_{11} - T_{22}. \tag{22}$$

Then, a logarithmic average temperature difference $\Delta T_m$ or average temperature $T_{ave}$ is calculated by equation (7) or (8) from the first and second temperature differences $\Delta\theta_1$ and $\Delta\theta_2$.

In step S5, a heat exchange quantity Q of the heat exchange unit 40 is calculated by equation (6), when the logarithmic average temperature difference $\Delta T_m$ is used, and by equation (9), when the average temperature $T_{ave}$ is used.

In step S6, the target heat quantity $\phi_{ref}$ calculated in step S1 and the heat exchange quantity Q calculated in step S5 are compared. If it is confirmed that the target heat quantity $\phi_{ref}$ and the heat exchange quantity Q are equal, or substantially equal, by minimum value judgment, or the like, the flow advances to step S7. If NO, the flow returns to step S3 to change the flow amount of the second medium. Then, the operations of steps S3 to S6 are repeated.

In step S7, the flow amount of the second medium determined in step S6 is set as a target flow amount $F_{2ref}$ of the second medium.

The logarithmic average temperature difference in step S4 is a singular point when $\Delta\theta_2 = \Delta\theta_1$, and its solution becomes indefinite. At the singular point, calculation must be performed by substituting an average temperature value. Except for this, the logarithmic average temperature difference expresses the characteristics of a heat exchange unit 40 accurately. Therefore, the flow amount of the second medium can be calculated more accurately to realize stable temperature control.

If an average temperature is to be employed, desirably, it is used when $(\Delta\theta_2 - \Delta\theta_1)$ in the heat exchange unit 40 is small, or when the error of the average temperature from the logarithmic average temperature difference is negligible.

Therefore, according to the second embodiment, the temperature fluctuations of the first medium caused by the fluctuations of the load 22 are detected by the second temperature sensor 14. The temperature fluctuations of the second medium caused by the temperature fluctuations of factory cooling water 39 are detected by the third temperature sensor 36. The logarithmic average temperature difference or average temperature in the heat exchange unit 40 is calculated by a flow amount operation unit 62. In addition, the flow amount of the second medium, which is necessary to set the first medium to the predetermined temperature, is calculated, to adjust a control valve 34. The heat of the first medium is recovered by the heat exchange unit 40. Then, the temperature of the first medium is controlled by a first temperature sensor 16 and temperature controller 56.

Even when the load fluctuates sharply, or the temperature of the factory cooling water fluctuates, heat can be recovered quickly and appropriately, so that stable temperature control can be performed.

According to the second embodiment, power devices, such as a compressor or an inverter, and mechanical components, such as a condenser, an evaporator, or an expansion valve, which are used in the prior art, become unnecessary. A power-saving, high-efficiency, low-cost, and compact cooling apparatus for performing cooling or heat recovery, which can control temperature very stably against load fluctuations and factory cooling water fluctuations, when factory cooling water having a temperature lower than a predetermined temperature is supplied, can be formed.

Figure 3:
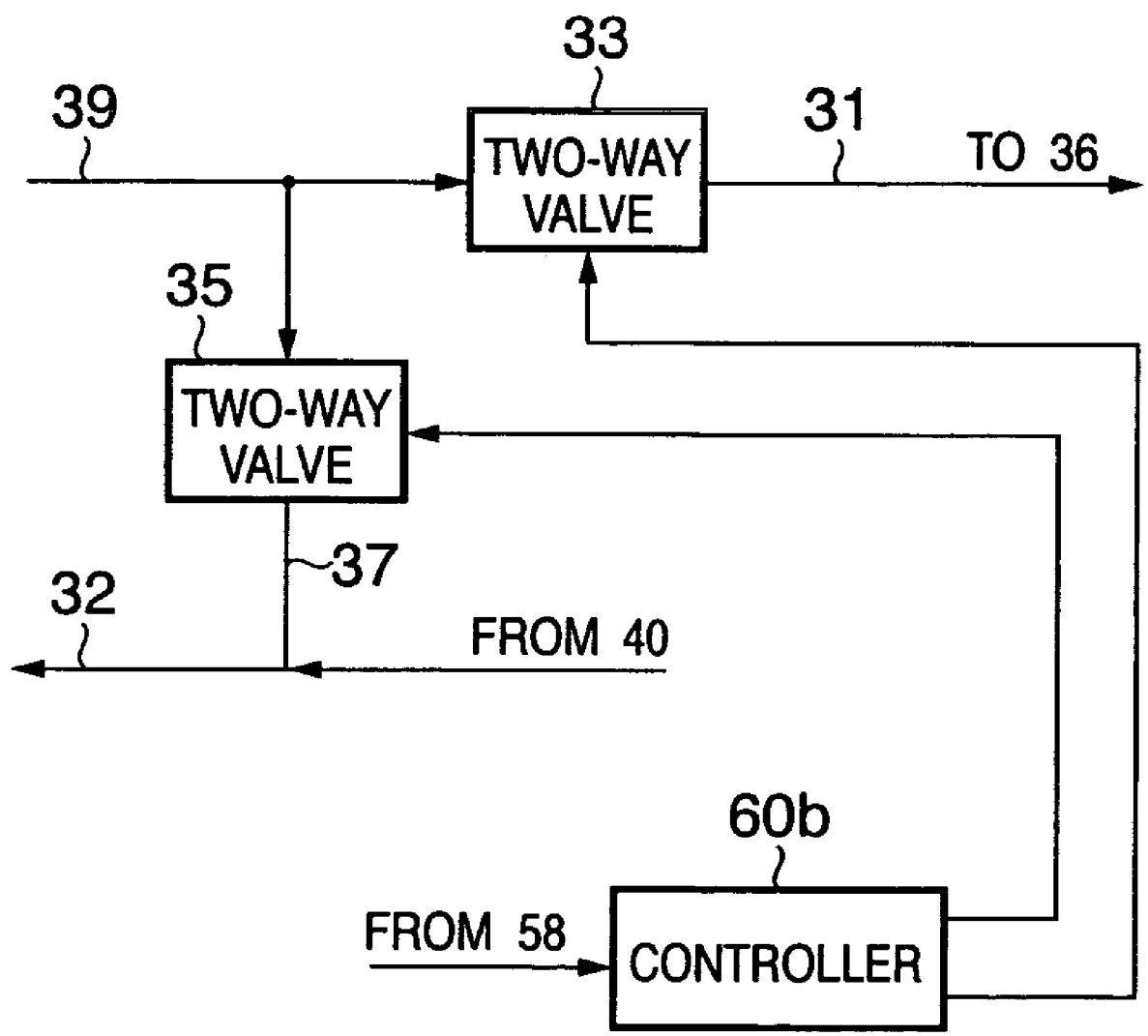
FIG. 3 is a block diagram showing an example of the structure of a control valve according to the first embodiment of the present invention.

In the same manner as in the first embodiment, to improve the nonlinearity of the control valve 34, the two proportional two-way valves (or proportional electromagnetic valves) 33 and 35, shown in FIG. 3, may be used.

The flow amount may be feedback-controlled by the flow amount sensor 38 and flow amount controller 60 of FIG. 2. As described above, when flow amount control is to be performed, operation of the flow amount controller 60 includes proportional/integral/derivative control, or the like.

Hence, according to the second embodiment, the flow amount of the second medium is controlled by the flow amount sensor 38 and flow amount controller 60, with respect to the target flow amount from the temperature controller 56, and a flow amount operation unit 62a. Heat is recovered more accurately, and, accordingly, the temperature of the first medium can be controlled more stably.

Figure 9:
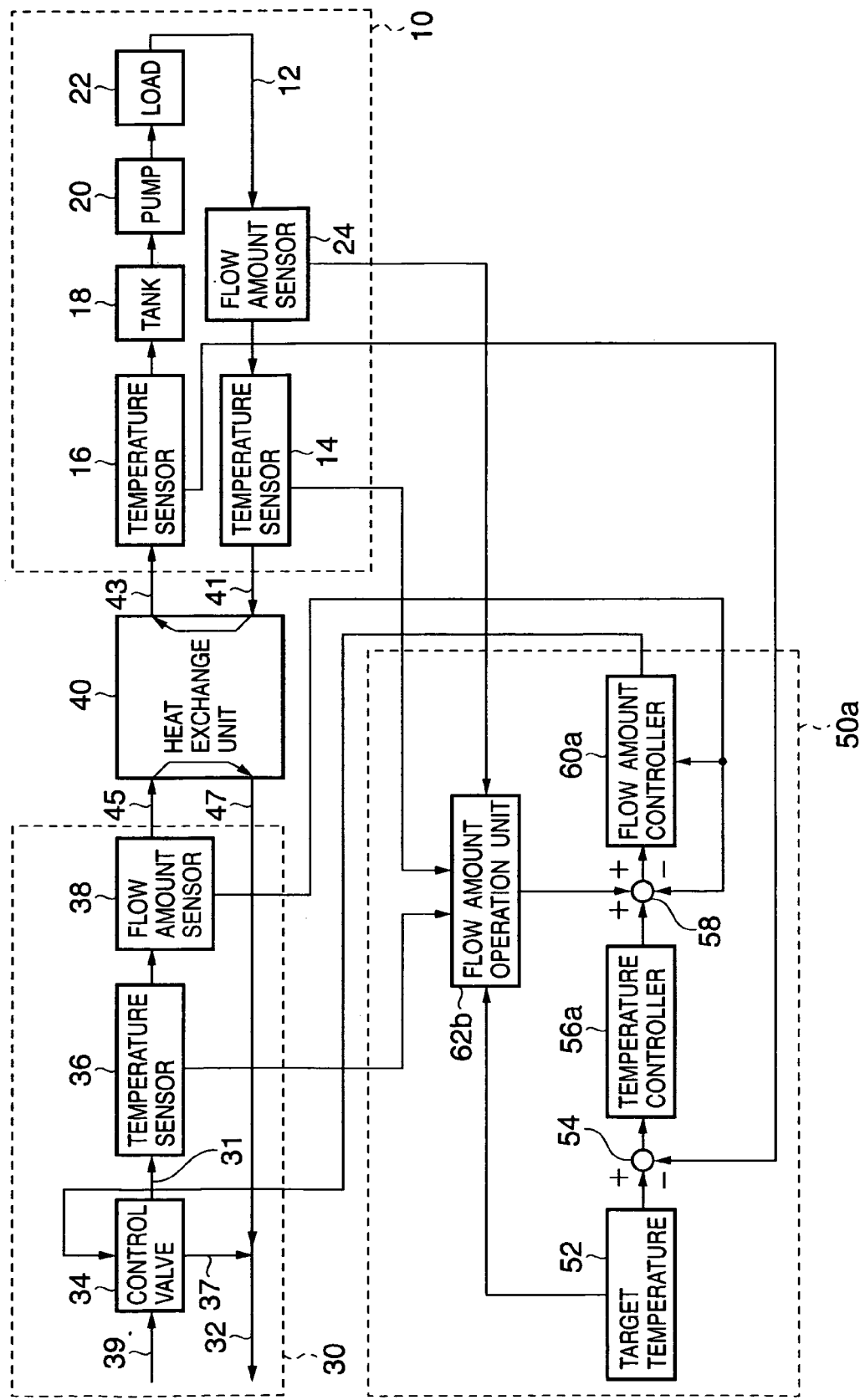
FIG. 9 is a block diagram of a cooling apparatus in an exposure apparatus according to the second embodiment of the present invention.

FIG. 9 is a block diagram of a cooling apparatus, which is obtained by adding new functions to the second embodiment.

Portions having the same functions as their counterparts in FIG. 2 are denoted by the same reference numerals. A description will be made of a temperature controller 56a, flow amount controller 60a, and flow amount operation unit 62b, which have different functions.

Figure 10:
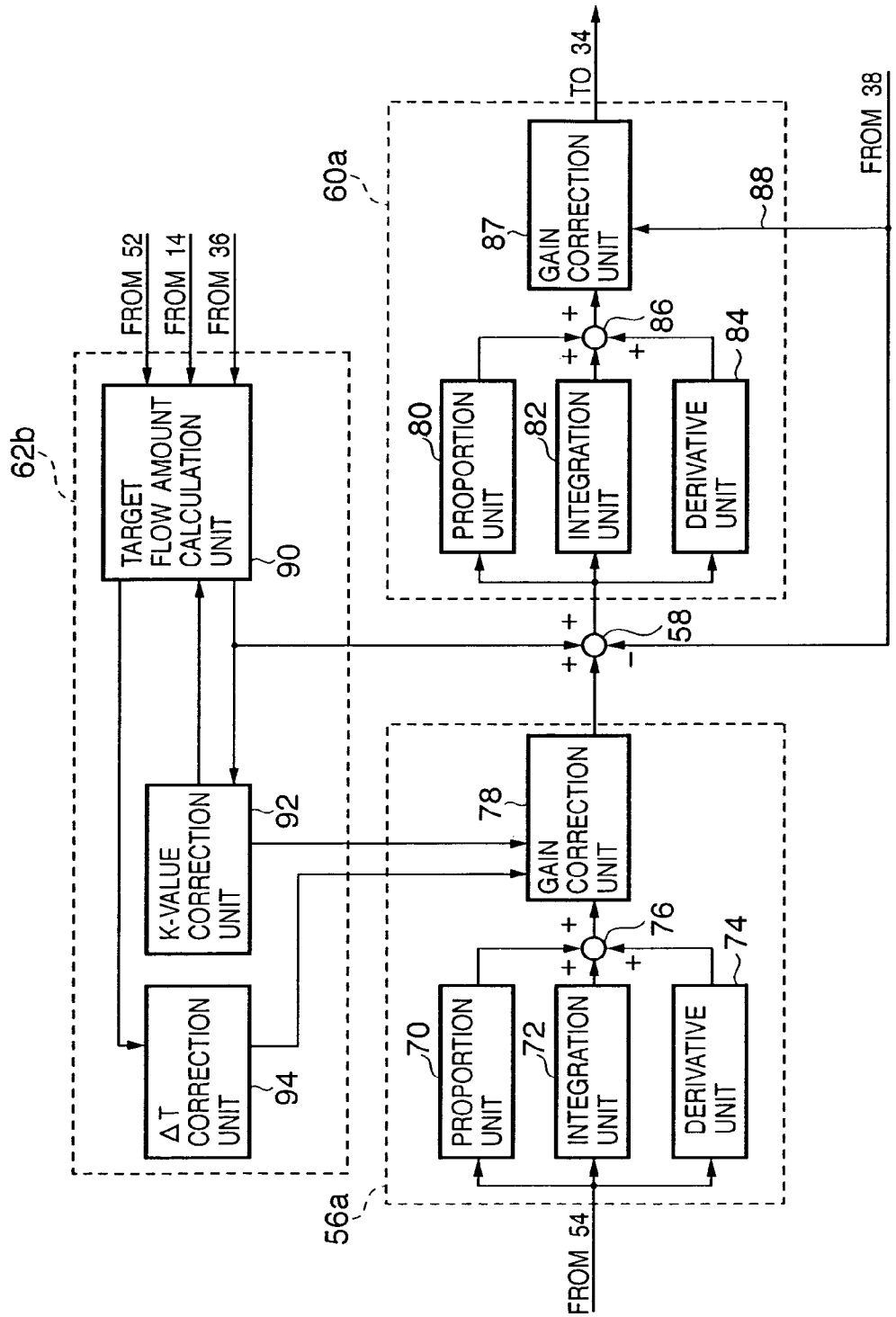
FIG. 10 is a block diagram showing examples of the flow amount operation unit, a temperature controller, and a flow amount controller according to the second embodiment of the present invention.

FIG. 10 shows an example of the detailed arrangement of the temperature controller 56a, flow amount controller 60a, and flow amount operation unit 62b.

The flow amount operation unit 62b includes a target flow amount calculation unit 90, K-value correction unit 92, and ΔT correction unit 94. The target flow amount calculation unit 90 calculates the target flow amount by the operation flow of FIG. 8, described in advance.

The characteristics of a heat passing ratio K of a heat exchange unit 40 will be described with reference to FIG. 1.

Figure 11:
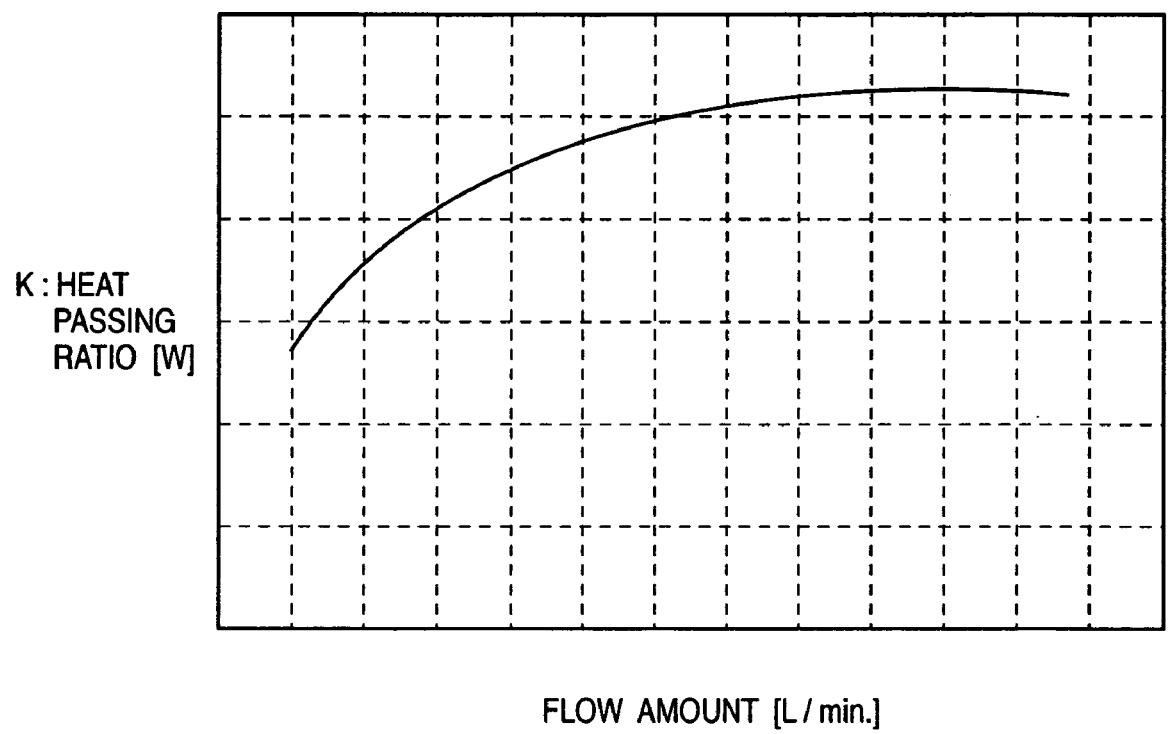
FIG. 11 is a graph showing an example of the heat passing ratio characteristics of a heat exchange unit according to the second embodiment of the present invention.

Referring to FIG. 11, the axis of the abscissa represents the flow amount of the second medium in the heat exchange unit 40, and the axis of the ordinate represents the heat passing ratio K. In general, the heat passing ratio of the heat exchange unit 40 is not constant with respect to the flow amount, but has flow amount dependence, as shown in FIG. 11. To obtain these characteristics, data may be acquired as the characteristics of the heat exchange unit 40, or a characteristic equation, or the like, may be acquired from the manufacturer of the heat exchange unit. When the flow amount is decreased, the heat passing ratio K decreases often. When the heat passing ratio K decreases, the heat exchange quantity in the heat exchange unit 40, which is obtained with equation (9), also decreases. Then, an error occurs undesirably in the calculation of the target flow amount of the second medium.

Referring back to FIG. 10, the K-value correction unit 92 has a correction table or characteristic equation for the heat passing ratio K, with respect to the flow amount of the second medium, as described above. More specifically, the heat passing ratio K is corrected with respect to the flow amount of the second medium input from the target flow amount calculation unit 90, and the corrected ratio K is output to the target flow amount calculation unit 90.

In the operation flow of FIG. 8 described above, the K value is corrected by the K-value correction unit 92 in accordance with the preset flow amount $F_{2set}$ of the second medium. Before the heat exchange quantity Q is calculated in step S5, $G_3$ of equation (15) is changed, and calculation is performed.

This can suppress the influence of the heat passing ratio of the heat exchange unit 40, which depends on the flow amount of the second medium, so that the flow amount of the second medium, which is necessary to constantly perform accurate heat exchange, can be calculated. Then, a cooling apparatus for performing cooling or heat recovery, which can control temperature more stably, can be formed.

The K-value correction unit 92 outputs a gain correction signal to a gain correction unit 78 in the temperature controller 56a. The heat exchange quantity Q in the heat exchange unit 40 is expressed by equation (6) or (9). When the temperature is to be fed back by the first temperature sensor 16 to perform feedback control by the temperature controller 56a, the heat passing ratio K of the heat exchange unit 40 forms one element of the loop again in the control loop.

As described above, as the heat passing ratio K is changed by the flow amount of the second medium, the loop gain of the temperature control system also changes consequently. When the loop gain changes, the response speed of the temperature control system may greatly decrease. Depending on the case, the temperature control system may undesirably oscillate or cause very large temperature fluctuations. The K-value correction unit 92 outputs the fluctuation amount of the K value to the gain correction unit 78. The gain correction unit 78 corrects the loop gain so that the loop gain of the temperature control system constantly has a predetermined value, regardless of the fluctuation amount of the K value.

Furthermore, the ΔT correction unit 94 outputs a ΔT correction signal to the gain correction unit 78 in the temperature controller 56a. The heat exchange quantity Q in the heat exchange unit 40 is expressed by equation (6) or (9). The logarithmic average temperature difference $\Delta T_m$ or average temperature $T_{ave}$ becomes the gain of the heat exchange unit 40 to accordingly form one element of the loop gain in the temperature control loop.

The logarithmic average temperature difference $\Delta T_m$ or average temperature $T_{ave}$ is changed by the fluctuations in the load 22, the temperature fluctuations in the factory cooling water 39, and the preset flow amount of the second medium. The ΔT correction unit 94 calculates the fluctuation amount from $\Delta T_m$ or $T_{ave}$, which is predetermined as a reference value, and outputs it to the gain correction unit 78. The gain correction unit 78 corrects the loop gain, so that the loop gain of the temperature control system constantly has a predetermined value, regardless of the fluctuation amount of ΔT.

A proportion unit 70, an integration unit 72, a derivative unit 74, and an addition unit 76, in the temperature controller 56a, are control operation units, which perform proportional/integral/derivative control, or the like, described above.

The flow amount controller 60a may have a gain correction unit 87. As described with reference to FIG. 7, the control valve 34 often has nonlinearity. Hence, the gain correction unit 87 performs gain correction to correct the nonlinearity of the control valve 34 on the basis of the flow amount feedback signal from a flow amount sensor 38. The characteristics of the nonlinearity of the control valve 34 may be measured in advance. Alternatively, a characteristic equation may be acquired from the manufacturer, and the gain may be corrected on the basis of the acquired characteristics.

A proportion unit 80, an integration unit 82, a derivative unit 84, and an addition unit 86, in the flow amount controller 60a, are control operation units, which perform proportional/integral/derivative control, or the like, described above.

According to the second embodiment, a change in characteristics of the heat exchange unit 40, which depends on the flow amount of the second medium, can be corrected by the K-value correction unit 92, the ΔT correction unit 94, and the gain correction unit 78 in the temperature controller 56a. As a result, a cooling apparatus for performing cooling or heat recovery, which can always control temperature very stably against load fluctuations and factory cooling water fluctuations, regardless of the flow amount of the second medium, can be formed.

Third Embodiment

The third embodiment of the present invention will be described.

In the third embodiment, the operation method of the flow amount operation unit 62 in the block diagram of the cooling apparatus in FIG. 2 of the first embodiment is different. This will be described with reference to FIG. 12.

Figure 12:
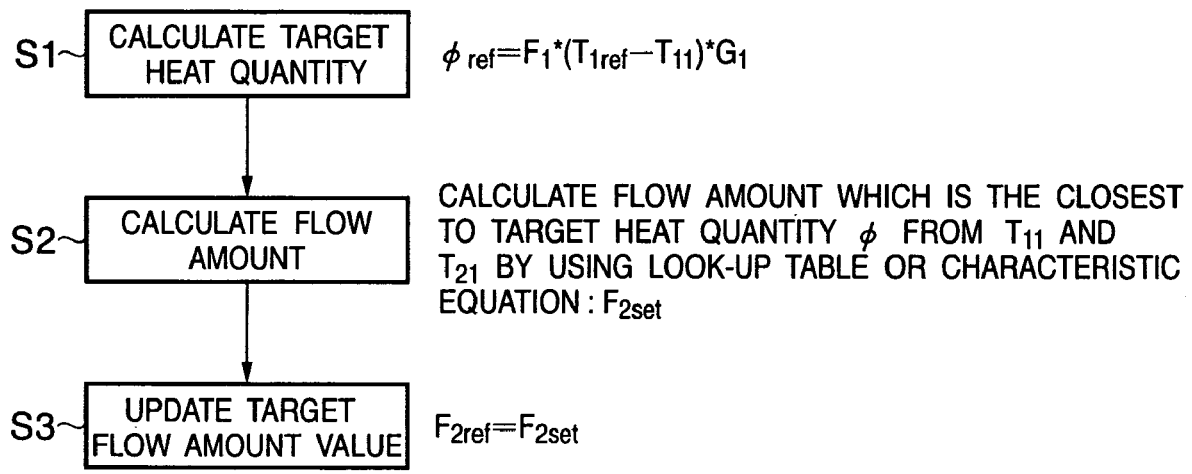
FIG. 12 is an operation flowchart of a flow amount operation unit according to the third embodiment of the present invention.

FIG. 12 is an operation flowchart of a flow amount operation unit according to the third embodiment of the present invention.

In step S1, a target heat quantity $\phi_{ref}$ is calculated from a target temperature $T_{1ref}$ from a target temperature 52 and a temperature $T_{11}$ from a second temperature sensor 14 (see equations (11) to (13)).

When a flow amount sensor 24 is attached, $F_1$ may be calculated on the basis of the value from the flow amount sensor 24. If a regulated flow amount value is set in advance, $F_1$ may be calculated by substituting it.

In step S2, the flow amount of the second medium, which is equal to or substantially equal to the target flow amount $\phi_{ref}$, is calculated from the temperature $T_{11}$ from the second temperature sensor 14 and a temperature $T_{21}$ from a third temperature sensor 36, by using a look-up table or characteristic equation, which represents the relationship between the flow amount of the second medium of the heat exchange unit 40 and the heat exchange quantity.

The look-up table or characteristic equation will be described with reference to FIG. 13.

Figure 13:
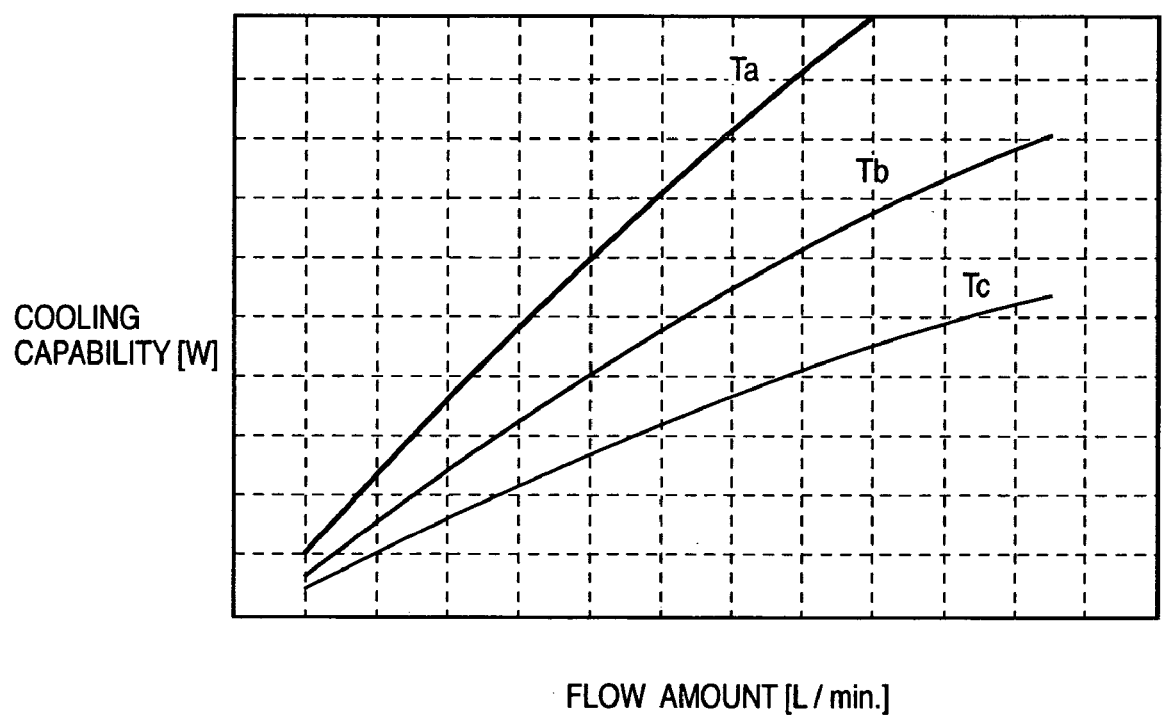
FIG. 13 is a graph showing an example of the heat exchange characteristics of a heat exchange unit according to the third embodiment of the present invention.

FIG. 13 shows the heat exchange quantity (cooling capability) of the heat exchange unit 40 with respect to the flow amount of the second medium where the temperature $T_{11}$ is a constant temperature and the temperature $T_{21}$ serves as parameters Ta, Tb, and Tc (Ta<Tb<Tc).

Note that $T_{21}$<$T_{11}$, and that the first medium is to be cooled by the second medium. In this case, the lower the temperature of the second medium, the higher the cooling capability, and heat exchange can be performed with a smaller flow amount. Accordingly, for the respective temperatures $T_{11}$, a look-up table or characteristic equation, as shown in FIG. 13, using the temperature $T_{21}$ is obtained, which shows the characteristics of the heat exchange quantity with respect to the flow amount of the second medium. Thus, in step S2 of FIG. 12, the flow amount of the second medium, which is equal to or substantially equal to the target flow amount $\phi_{ref}$, can be calculated.

The characteristics of the look-up table or characteristic equation may be measured in advance. Alternatively, the characteristic equation may be acquired from the manufacturer or created on the basis of a theoretical calculation value.

In step S3 of FIG. 12, the flow amount of the second medium, which is calculated in step S2, is set as a target flow amount $F_{2ref}$ of the second medium.

Therefore, according to the third embodiment, the temperature fluctuations of the first medium caused by the fluctuations of the load, or the like, are detected by the second temperature sensor 14. The temperature fluctuations of the second medium are detected by the third temperature sensor 36. The flow amount of the second medium, which is necessary to set the first medium to the predetermined temperature, is calculated from the look-up table or characteristic equation to adjust a control valve 34. The heat of the first medium is recovered by the heat exchange unit 40. Then, the temperature of the first medium is controlled by the first temperature sensor 16 and a temperature controller 56.

Even when the load fluctuates sharply or the temperature of the factory cooling water fluctuates, heat can be recovered quickly and appropriately, so that stable temperature control can be performed. Hence, a power-saving, high-efficiency, low-cost, and compact cooling apparatus for performing cooling or heat recovery, which can control temperature stable against load fluctuations and factory cooling water fluctuations, when factory cooling water having a temperature lower than a predetermined temperature is supplied, can be formed.

As described above, according to a given embodiment, when the load fluctuates sharply or the temperature of the factory cooling water fluctuates, heat can be recovered quickly and appropriately, so that stable temperature control can be performed. Hence, a power-saving, high-efficiency, low-cost, and compact cooling apparatus for performing cooling or heat recovery, which can control temperature stably against load fluctuations and factory cooling water fluctuations, when factory cooling water having a low temperature is supplied, can be formed.

According to a given embodiment, the flow amount of the second medium is controlled by the flow amount sensor and flow amount control valve with respect to the target flow amount from the temperature controller and flow amount operation unit. Heat is recovered more accurately, and, accordingly, the temperature of the first medium can be controlled more stably.

According to a given embodiment, a change in characteristics of the heat exchange unit, which depends on the flow amount of the second medium, can be corrected by the heat exchange gain correction unit and temperature control gain correction unit. As a result, a cooling apparatus for performing cooling or heat recovery, which can always control temperature very stably against load fluctuations and factory cooling water fluctuations, regardless of the flow amount of the second medium, can be formed.

A given embodiment is not limited to a cooling apparatus not using a compressor, or the like, but can be widely applied to a cooling apparatus or heating or warming apparatus, which has a heat exchange unit.

According to a given embodiment, even when the load fluctuates sharply or the temperature of the second medium, which is input to the heat exchange unit, fluctuates, heat can be recovered quickly and appropriately. Thus, the temperature can be controlled very stably.

When the load fluctuations are small and fluctuations in temperature of the first medium at the inlet to the heat exchange unit are small, the second temperature sensor need not be included. In this case, the flow amount of the second medium, which is necessary to set the first medium to the predetermined temperature, may be calculated from the target temperature and the output from a temperature sensor, which detects the temperature of the second medium on the basis of the predetermined temperature of the first medium. When the temperature fluctuations of the second medium are small, the third temperature sensor need not be included. In this case, the flow amount of the second medium, which is necessary to set the first medium to the predetermined temperature, may be calculated from the target temperature and the output from the second temperature sensor, which detects the temperature of the first medium on the basis of the predetermined temperature of the second medium.

[Application of Exposure Apparatus]

A semiconductor device manufacturing process, which uses the exposure apparatus described above, will be described.

Figure 14:
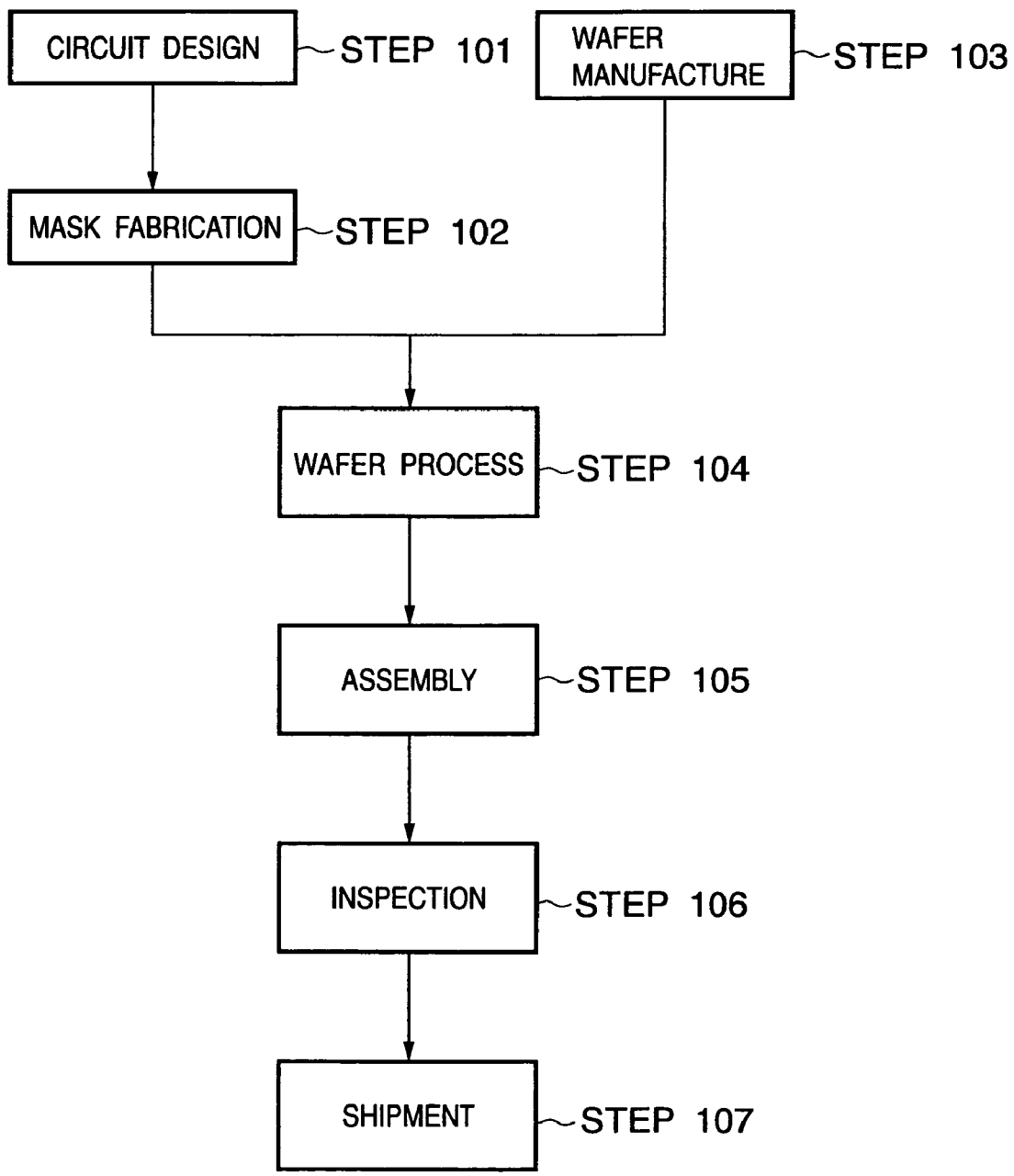
FIG. 14 is a flowchart showing the flow of an entire semiconductor device manufacturing process.

FIG. 14 shows the flow of the entire semiconductor device manufacturing process.

In step 101 (circuit design), the circuit of a semiconductor device is designed. In step 102 (mask fabrication), a mask is fabricated on the basis of the designed circuit pattern. In step 103 (wafer manufacture), a wafer is manufactured using a material such as silicon.

In step 104 (wafer process), called a preprocess, an actual circuit is formed on the wafer in accordance with lithography using the above mask and wafer. In the next step, step 105 (assembly), called a post-process, a semiconductor chip is formed from the wafer fabricated in step 104. This step includes assembly processes, such as assembly (dicing and bonding) and packaging (chip encapsulation). In step 106 (inspection), inspections, such as an operation check and a durability test, of the semiconductor device fabricated in step 105, are performed. A semiconductor device is finished with these steps and shipped (step 107).

Figure 15:
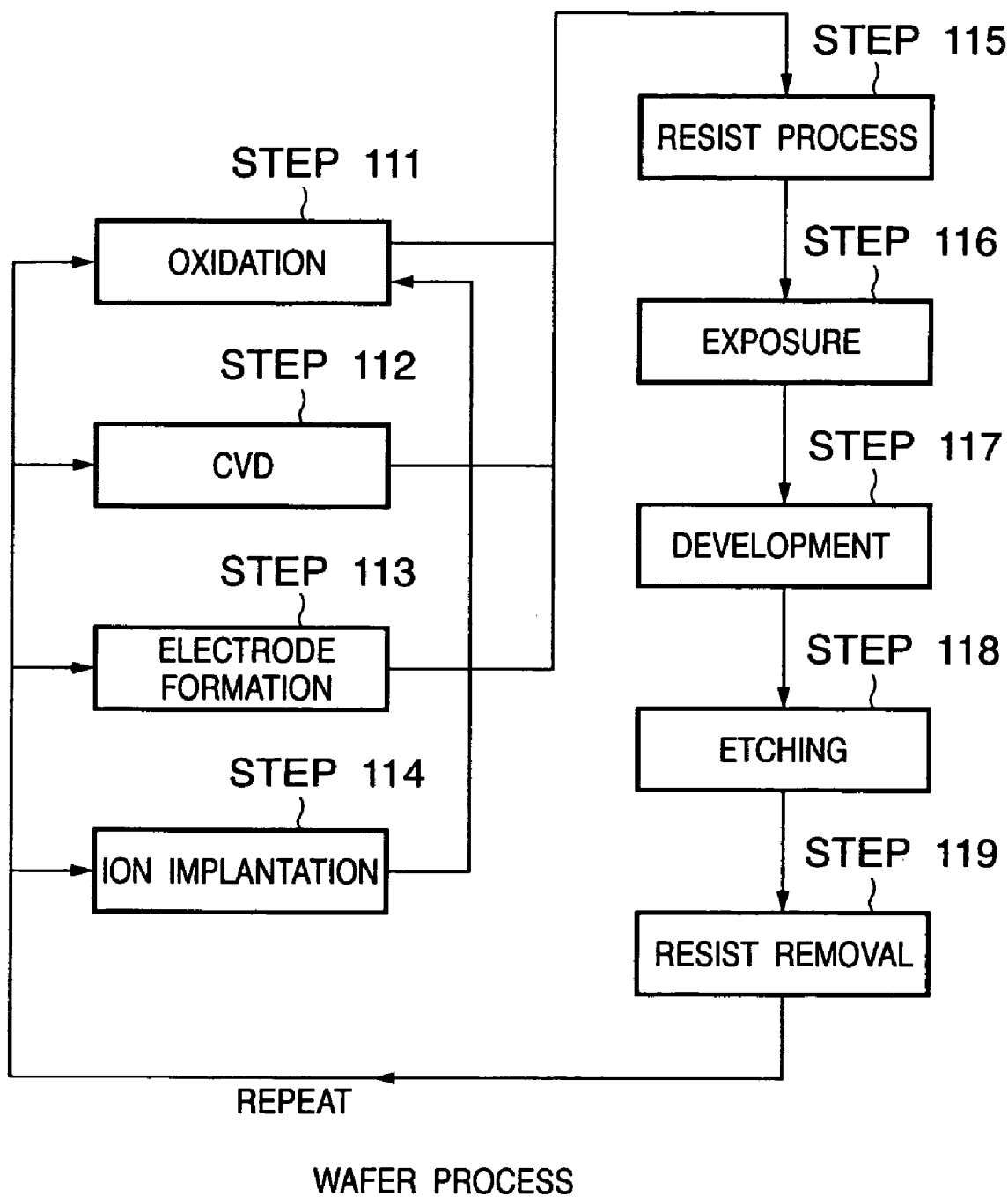
FIG. 15 is a flowchart showing the detailed flow of the wafer process of FIG. 14.

FIG. 15 shows the flow of the above wafer process in detail.

In step 111 (oxidation), the surface of the wafer is oxidized. In step 112 (CVD), an insulating film is formed on the wafer surface. In step 113 (electrode formation), an electrode is formed on the wafer by deposition. In step 114 (ion implantation), ions are implanted in the wafer. In step 115 (resist process), a photosensitive agent is applied to the wafer.

In step 116 (exposure), the circuit pattern is transferred to the wafer by the above exposure apparatus. In step 117 (development), the exposed wafer is developed. In step 118 (etching), portions other than the developed resist image are removed. In step 119 (resist removal), any unnecessary resist remaining after etching is removed. These steps are repeated to form multiple circuit patterns on the wafer.

The present invention is not limited to the above embodiments, and various changes and modifications can be made within the spirit and scope of the present invention. Therefore, to apprise the public of the scope of the present invention, the following claims are made.

What is claimed is:

1. A heat exchange method which uses a heat exchange unit for exchanging heat between first and second media to adjust a temperature of the first medium, said method comprising:
   (a) a detection step of detecting temperatures of the first and second media to enter the heat exchange unit; and
   (b) an adjustment step of adjusting a flow rate of the second medium based on the temperatures of the first and second media detected in said detection step,
   wherein said adjustment step comprises:
      (i) a target heat quantity calculation step of calculating a target heat quantity based on a target temperature of the first medium and the temperature of the first medium detected in said detection step;
      (ii) a first temperature difference calculation step of calculating a first temperature difference based on the target temperature and the temperature of the second medium detected in said detection step;
      (iii) a setting step of setting a provisional target flow rate of the second medium;
      (iv) a second temperature difference calculation step of calculating a second temperature difference based on the target heat quantity, the provisional target flow rate, and the temperatures of the first and second media detected in said detection step;
      (v) an average temperature difference calculation step of calculating one of a logarithmic average temperature difference and an average temperature difference at the heat exchange unit based on the first and second temperature differences;
      (vi) a heat exchange quantity calculation step of calculating a heat exchange quantity at the heat exchange unit based on one of the logarithmic average temperature difference and the average temperature difference and a heat exchange gain of the heat exchange unit; and
      (vii) a determination step of determining a target flow rate of the second medium based on a result of a comparison between the heat exchange quantity and the target heat quantity.

2. A method according to claim 1, wherein, in said adjustment step, the heat exchange gain of the heat exchange unit is corrected so as to decrease a change in characteristics of the heat exchange unit caused by the flow rate of the second medium.

3. A method according to claim 2, wherein the gain is corrected based on one of the logarithmic average temperature difference and the average temperature difference.

4. A heat exchange apparatus which uses a heat exchange unit for exchanging heat between first and second media to adjust a temperature of the first medium, said apparatus comprising:
   (a) a first sensor to detect a temperature of the first medium to enter the heat exchange unit;
   (b) a second sensor to detect a temperature of the second medium to enter the heat exchange unit; and
   (c) an adjustment system to adjust a flow rate of the second medium based on outputs from said first and second sensors,
   wherein said adjustment system:
      (i) calculates a target heat quantity based on a target temperature of the first medium and the output from said first sensor;
      (ii) calculates a first temperature difference based on the target temperature and the output from said second sensor;
      (iii) sets a provisional target flow rate of the second medium;
      (iv) calculates a second temperature difference based on the target heat quantity, the provisional target flow rate, and the outputs from said first and second sensors;
      (v) calculates one of a logarithmic average temperature difference and an average temperature difference at the heat exchange unit based on the first and second temperature differences;
      (vi) calculates a heat exchange quantity at the heat exchange unit based on a heat exchange gain of the heat exchange unit and one of the logarithmic average temperature difference and the average temperature difference; and
      (vii) determines a target flow rate of the second medium based on a result of a comparison between the heat exchange quantity and the target heat quantity.

5. An apparatus according to claim 4, wherein said adjustment system corrects the heat exchange gain of the heat exchange unit so as to decrease a change in characteristics of the heat exchange unit caused by the flow rate of the second medium.

6. An apparatus according to claim 5, wherein the gain is corrected based on one of the logarithmic average temperature difference and the average temperature difference.

7. An apparatus comprising:

an exposure system, including a heat generation element, to expose a substrate to a pattern of an original; and a heat exchange apparatus, as defined in claim 4, to adjust a temperature of said heat generation element.

8. A method of manufacturing a device, said method comprising steps of:

exposing a substrate to a pattern using an apparatus as defined in claim 7;

developing the exposed substrate; and processing the developed substrate to manufacture the device.

* * * * *